US012757539B2

(12) United States Patent
Pan et al.

(10) Patent No.: US 12,757,539 B2
(45) Date of Patent: Oct. 6, 2026

(54) LAMP BEAD WITH MULTIPLE LIGHT-EMITTING SURFACES AND HOLDER THEREOF

(71) Applicant: FOSHAN NATIONSTAR OPTOELECTRONICS CO., LTD., Guangdong (CN)

(72) Inventors: Libing Pan, Guangdong (CN); Jiapeng Zhang, Guangdong (CN); Zhiguo Xie, Guangdong (CN); Alan Zhao, Foshan (CN); Fuhai Li, Guangdong (CN); Tao Chen, Guangdong (CN)

(73) Assignee: FOSHAN NATIONSTAR OPTOELECTRONICS CO., LTD., Guangdong (CN)

( * ) Notice: Subject to any disclaimer, the term of this patent is extended or adjusted under 35 U.S.C. 154(b) by 358 days.

(21) Appl. No.: 18/437,863

(22) Filed: Feb. 9, 2024

(65) Prior Publication Data

US 2024/0204147 A1 Jun. 20, 2024

(30) Foreign Application Priority Data

Dec. 14, 2022 (CN) ........................ 202211605259.X

(51) Int. Cl.

| | |
|---|---|
| ***H10H 20/85*** | (2025.01) |
| ***H10H 20/857*** | (2025.01) |
| ***H10W 90/00*** | (2026.01) |

(52) U.S. Cl.
CPC ...... *H10H 20/8506* (2025.01); *H10H 20/857* (2025.01); *H10W 90/00* (2026.01)

(58) Field of Classification Search
CPC .. H10H 20/8506; H10H 20/857; H10W 90/00
USPC ............................................................ 257/88
See application file for complete search history.

(56) References Cited

FOREIGN PATENT DOCUMENTS

| | | | | | |
|---|---|---|---|---|---|
| CN | 2918977 Y | * | 7/2007 | | |
| CN | 210866236 U | * | 6/2020 | | |
| CN | 112614922 A | * | 4/2021 | ........... | H10H 20/856 |
| CN | 214753827 U | * | 11/2021 | | |

* cited by examiner

*Primary Examiner* — Phuc T Dang
(74) *Attorney, Agent, or Firm* — CM Law PLLC; Stephen J. Weed

(57) ABSTRACT

A lamp bead holder includes a lead framework and a bowl-shaped cup. The bowl-shaped cup includes a cup bottom and a cup body. The lead framework is embedded within the cup bottom. The cup body is disposed on the lead framework. The bowl-shaped cup further includes a cross-shaped baffle. The cross-shaped baffle is disposed within the bowl-shaped cup to divide the inner cavity of the bowl-shaped cup into four cavities arranged in a 2×2 array.

18 Claims, 6 Drawing Sheets

LAMP BEAD WITH MULTIPLE LIGHT-EMITTING SURFACES AND HOLDER THEREOF

CROSS-REFERENCE TO RELATED APPLICATION(S)

This application claims priority to Chinese Patent Application No. 202211605259.X filed Dec. 14, 2022, the disclosure of which is incorporated herein by reference in its entirety.

TECHNICAL FIELD

The present disclosure relates to light-emitting diode (LED) technology and, in particular, to a lamp bead with multiple light-emitting surfaces and a holder thereof.

BACKGROUND

Most of the existing smart lighting and brightening products include an RGB or RGBW LED light-emitting unit. An LED chip with multiple colors is disposed within an LED lamp bead with a limited size, so the LED lamp bead has features of multi-circuit control, light adjustability, and color adjustability.

An applicant describes an LED device for a brightening system in Patent Document No. CN111725378A. An LED holder of the LED device is provided with three parallel cavities. A middle cavity is configured to place RGB chips, and two side cavities are configured to place white chips, respectively. However, the LED device has the defects below.

1. All the RGB chips are placed in the same cavity. Three chips emit light that affects each other, making it relatively difficult to perform light distribution. Different phosphors cannot be disposed to adjust the light and colors of the three chips, respectively.

2. The shape of each parallel cavity is narrow and long, resulting in a narrow and long light-emitting surface, and a die attachment region within each cavity for placing chips has a limited size, being not conducive to light emission and reliability.

3. To dispose the three parallel cavities and an LED chip with multiple colors within a small-size device, the distance between pads, the distance between pins, and others within a metal framework need to be narrowed, so a product is prone to silver migration of the metal framework under different voltages, resulting in electrical leakage or a short circuit.

4. A metal circuit has no optimized design to adapt to the arrangement of the three parallel cavities and the LED chip with multiple colors. Light-emitting colors of the three cavities are relatively fixed and cannot be flexibly changed.

SUMMARY

The present disclosure provides a lamp bead holder with multiple light-emitting surfaces. The lamp bead holder has four separate cavities for respectively placing four LED chips. This facilitates the separate and flexible adjustment of the type of each chip or a phosphor coated on the each chip so that a lamp bead using the lamp bead holder can enjoy multiple optional light distribution schemes.

The present disclosure adopts the technical schemes below.

A lamp bead holder with a plurality of light-emitting surfaces is provided. The lamp bead holder includes a lead framework and a bowl-shaped cup, where the bowl-shaped cup includes a cup bottom and a cup body, the lead framework is embedded within the cup bottom, and the cup body is disposed on the lead framework; and the bowl-shaped cup further includes a cross-shaped baffle, and the cross-shaped baffle is disposed within the bowl-shaped cup to divide an inner cavity of the bowl-shaped cup into four cavities arranged in a 2×2 array.

The lamp bead holder in the present disclosure has the four separate cavities in which four LED chips may be placed, respectively. A respective chip in each cavity emits light separately without interference from other chips. This facilitates the separate and flexible adjustment of the type of the each chip or a phosphor coated on the each chip. Light-emitting colors of the four chips may be combined freely so that the lamp bead can enjoy multiple optional light distribution schemes, facilitating the design and application of a multispectral synthesis scheme.

Moreover, the cross-shaped baffle is used in the present disclosure for separating the bowl-shaped cup with a limited size into the four cavities arranged in the 2×2 array, and the each cavity has an equivalent length and width and has a shape suitable for placing the respective chip so that limited shape and area of a respective chip placement region can be avoided due to the use of each parallel, narrow and long cavity in the related art.

From a perspective of production, the lamp bead holder in the present disclosure has high versatility and may satisfy the design and application of multiple lamp bead products so that a differential design link of light distribution of the lamp dead can be post positioned to a die attachment stage, and the structure of the holder does not need to be first adjusted and designed to satisfy a specific light distribution requirement of a final lamp bead product. Therefore, the process of manufacturing the holder does not need to be modified so that difficulty in light distribution can be simplified, the cost can be reduced, and feasibility can be higher, thereby facilitating the intelligent adjustment of a spectrum and multi-color temperature and obtaining various lamp beads that satisfy the application requirements of brightening, smart lighting, plant lighting and healthy lighting.

In one embodiment, the lead framework exposes three adjacent function portions in each of the four cavities, where the three adjacent function portions are spaced apart and insulated from each other. The three function portions are configured to place LED chips or for bonding wires, and only three function portions are disposed within the each of the four cavities so that sufficient insulation distances can be disposed between the three function portions.

In one embodiment, in two cavities of the four cavities in the same row, two of three function portions in one cavity are electrically connected to two of three function portions in another cavity respectively, and a remaining one of the three function portions in the one cavity is insulated from a remaining one of the three function portions in the another cavity.

In one embodiment, in each of the four cavities, one of the three function portions that is nearest to a center of the cross-shaped baffle has a maximum area; and in two cavities in the same row, one of the three function portions that has a maximum area in one cavity is electrically connected to one of the three function portions that has a maximum area in another cavity.

In one embodiment, one of three function portions that has a maximum area in each of at least one of the four cavities is provided with a die attachment region and a wire bonding region.

In one embodiment, a groove is disposed between the die attachment region and the wire bonding region. The groove prevents die attachment adhesive in the die attachment region from diffusing into the wire bonding region.

In one embodiment, a depth of the groove is less than half a thickness of the lead framework, a width of the groove is greater than 0.05 millimeters, and a length of the groove is greater than 0.2 millimeters.

In one embodiment, the lead framework includes eight pads spaced apart, clearances between adjacent pads are filled with the cup bottom of the bowl-shaped cup to enable the eight pads to be insulated from each other, and the eight pads are connected to pins disposed on an exterior of the bowl-shaped cup, respectively.

In one embodiment, an edge of each of the eight pads is provided with a protruded step. Therefore, a contact area between the each of the eight pads and the bowl-shaped cup is enlarged to enhance the bonding strength of the each of the eight pads and the bowl-shaped cup.

In one embodiment, the eight pads are two common die attachment pads, two common wire bonding pads and four non-common pads respectively; the two common die attachment pads are disposed within two rows of the four cavities respectively, and each of the two common die attachment pads is connected to two cavities in a row in which the each of the two common die attachment pads is located, and two function portions electrically connected are formed within the two cavities in the row; the two common wire bonding pads are disposed within the two rows of the four cavities respectively, and each of the two common wire bonding pads is connected to two cavities in a row in which the each of the two common wire bonding pads is located, and two function portions electrically connected are formed within the two cavities in the row; and the four non-common pads are disposed within the four cavities respectively, and four function portions are formed within the four cavities respectively.

In one embodiment, the cross-shaped baffle is disposed on the lead framework and the cup bottom of the bowl-shaped cup, and is connected to the lead framework through a through hole that passes through the lead framework to enhance the bonding force.

The present disclosure further provides a lamp bead with a plurality of light-emitting surfaces including the preceding lamp bead holder and four light-emitting units, where the four light-emitting units are disposed within four cavities of the lamp bead holder respectively, and each of the four light-emitting units includes an LED chip connected to a lead framework.

In one embodiment, the lead framework includes eight pads spaced apart, and ends of the eight pads are connected to four positive pins disposed on one side of a bowl-shaped cup and four negative pins disposed on another side of the bowl-shaped cup respectively, where the one side of the bowl-shaped cup and the another side of the bowl-shaped cup are opposite sides of the bowl-shaped cup.

For a better understanding and implementation, the present disclosure is described in detail below in conjunction with drawings.

REFERENCE LIST

Figure 1:
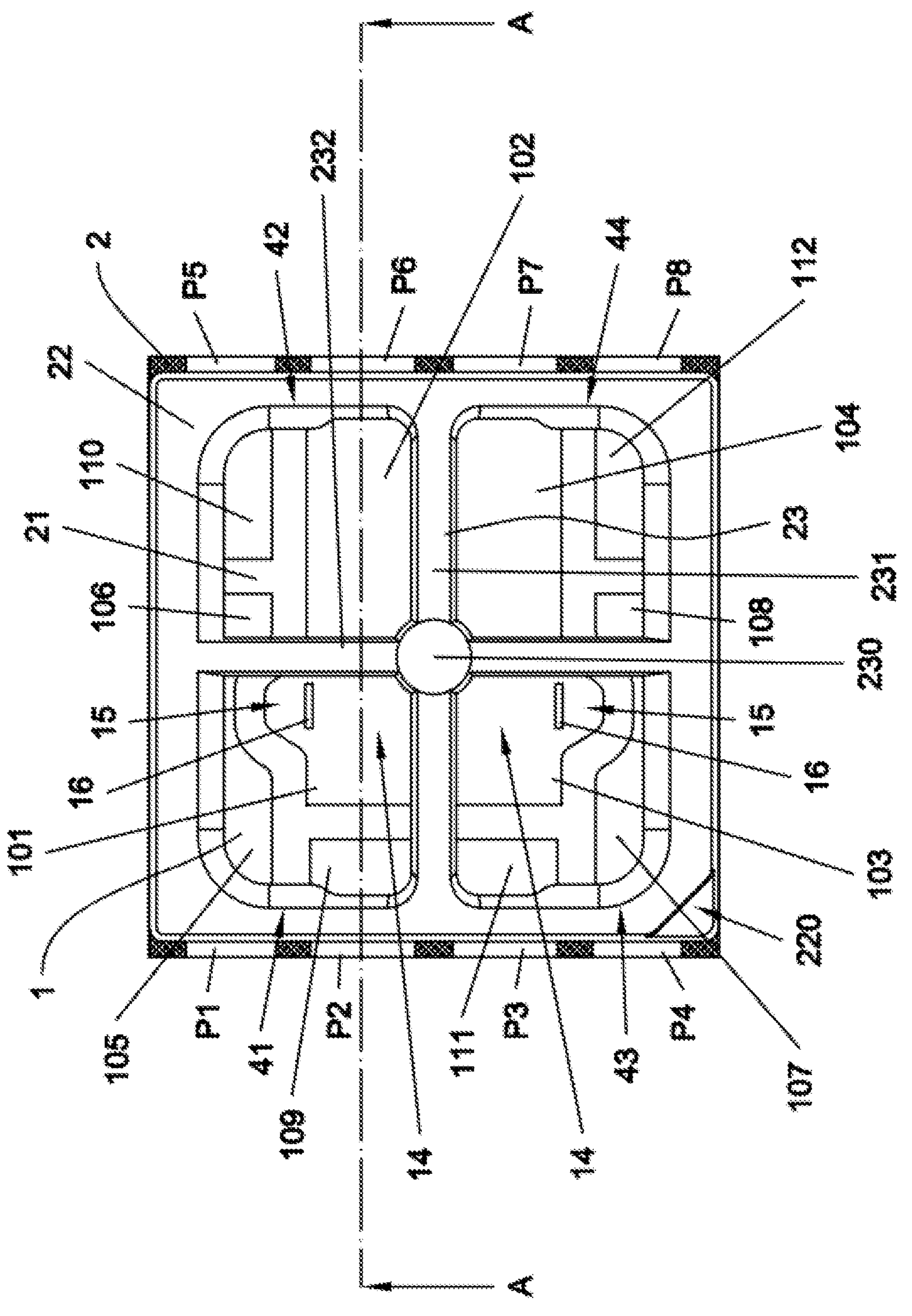
FIG. 1 is a front view illustrating the structure of a lamp bead holder with multiple light-emitting surfaces according to the present disclosure.

1 lead framework
2 bowl-shaped cup
21 cup bottom
22 cup body
23 cross-shaped baffle
231 first baffle
232 second baffle
230 cylinder
220 unfilled corner
41 first cavity
42 second cavity
43 third cavity
44 fourth cavity
11*a* common die attachment pad
lib common die attachment pad
12*a* common wire bonding pad
12*b* common wire bonding pad
13*a* non-common pad
13*b* non-common pad
13*c* non-common pad
13*d* non-common pad
101 function portion
102 function portion
103 function portion
104 function portion
105 function portion
106 function portion
107 function portion
108 function portion
109 function portion
110 function portion
111 function portion
112 function portion
14 die attachment region
wire bonding region
16 groove
17 protruded step
18 through hole
P1 pin P2 pin
P3 pin
P4 pin
P5 pin
P6 pin
P7 pin
P8 pin
P9 pin
L1 first light-emitting unit
L2 second light-emitting unit
L3 third light-emitting unit
L4 fourth light-emitting unit
31 first LED chip
32 second LED chip
33 third LED chip
34 fourth LED chip
(R) red light-emitting unit
(G) green light-emitting unit
(B) blue light-emitting unit
(W) white light-emitting unit

DETAILED DESCRIPTION

Referring to FIGS. 1 to 4, a lamp bead holder with multiple light-emitting surfaces in the present disclosure includes a lead framework 1 and a bowl-shaped cup 2. The bowl-shaped cup 2 includes a cup bottom 21, a cup body 22 and a cross-shaped baffle 23. The lead framework 1 is embedded within the cup bottom 21. The cup body 22 is disposed on the front surface of the lead framework 1. The cross-shaped baffle 23 is disposed within the bowl-shaped cup 2 to divide the inner cavity of the bowl-shaped cup 2 into four cavities arranged in a 2×2 array.

The lead framework 1 is made of a metal plate, preferably, a copper plate. The bowl-shaped cup 2 is an integrally molded structure achieved by performing injection molding on the lead framework 1. The material is plastic, preferably white plastic.

The cross-shaped baffle 23 is disposed on the lead framework 1 and the cup bottom 21 and is connected to the cup bottom 21, the cup body 22 and the lead framework 1.

The cross-shaped baffle 23 is composed of a first baffle 231 and a second baffle 232 that are perpendicularly connected, and the perpendicularly connected portion is a cylinder 230. To enhance the bonding force between the cross-shaped baffle 23, the lead framework 1 and the cup bottom 21, the cross-shaped baffle 23 is further connected to the lead framework 1 through a through hole 18 that passes through the lead framework 1.

In an embodiment illustrated in the present disclosure, the bowl-shaped cup 2 is square, and the outline of its inner cavity is a square with four rounded corners. The top surface of the cup body 22 of the bowl-shaped cup 2 is also provided with a concave unfilled corner 220 for polarity identification. The first baffle 231 is connected to two opposite inner walls of the cup body 22. The second baffle 232 is connected to the other two opposite inner walls of the cup body 22. Consequently, the shape of each cavity separated by the cross-shaped baffle 23 is also square.

In the four cavities arranged in the 2×2 array as shown in FIG. 1, two rows of cavities are located on two sides of the first baffle 231 respectively and are symmetrical along the first baffle 231. The first row of cavities include a first cavity 41 and a second cavity 42. The second row of cavities include a third cavity 43 and a fourth cavity 44. Two columns of cavities are located on two sides of the second baffle 232 respectively and are symmetrical along the second baffle 232. The first column of cavities includes the first cavity 41 and the third cavity 43. The second column of cavities include the second cavity 42 and the fourth cavity 44. The four cavities are arranged in a square array with left-right symmetry and upper-lower symmetry.

The front surface of the lead framework 1 is exposed in the four cavities separately. Portions exposed in the each cavity are three adjacent function portions, where the three adjacent function portions are spaced apart and insulated from each other. The three function portions are configured to place LED chips or for bonding wires.

To mount the LED chips in the middle of the bowl-shaped cup 2 to enable a lamp bead to achieve a good light-emitting effect, a function portion that is nearest to the center of the cross-shaped baffle 23 within the each cavity has the maximum area, that is, a function portion that is nearest to the cylinder 230 has the maximum area, for supplying a die attachment region to place a respective LED chip.

In each row of two cavities, two function portions in one cavity are electrically connected to two function portions in the other cavity. The remaining function portion in each cavity is insulated from the remaining function portion in the other cavity. Function portions within each column of two cavities are insulated from each other. Function portions within two pairs of diagonally arranged cavities are also insulated from each other. In addition, in the each row of two cavities, a function portion that has the maximum area in the cavity is electrically connected to a function portion that has the maximum area in the other cavity.

Figure 2:
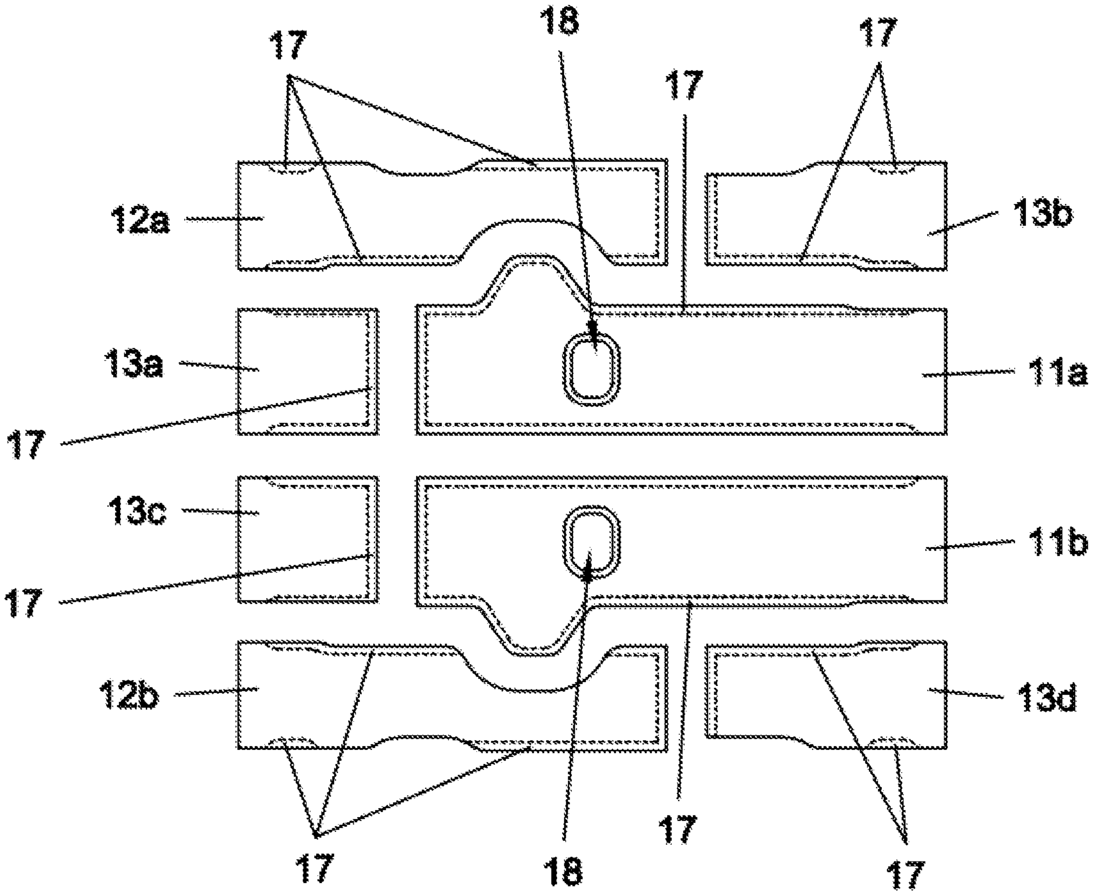
FIG. 2 is a front view illustrating the pad arrangement of a lead framework in a lamp bead holder with multiple light-emitting surfaces according to the present disclosure.
Figure 3:
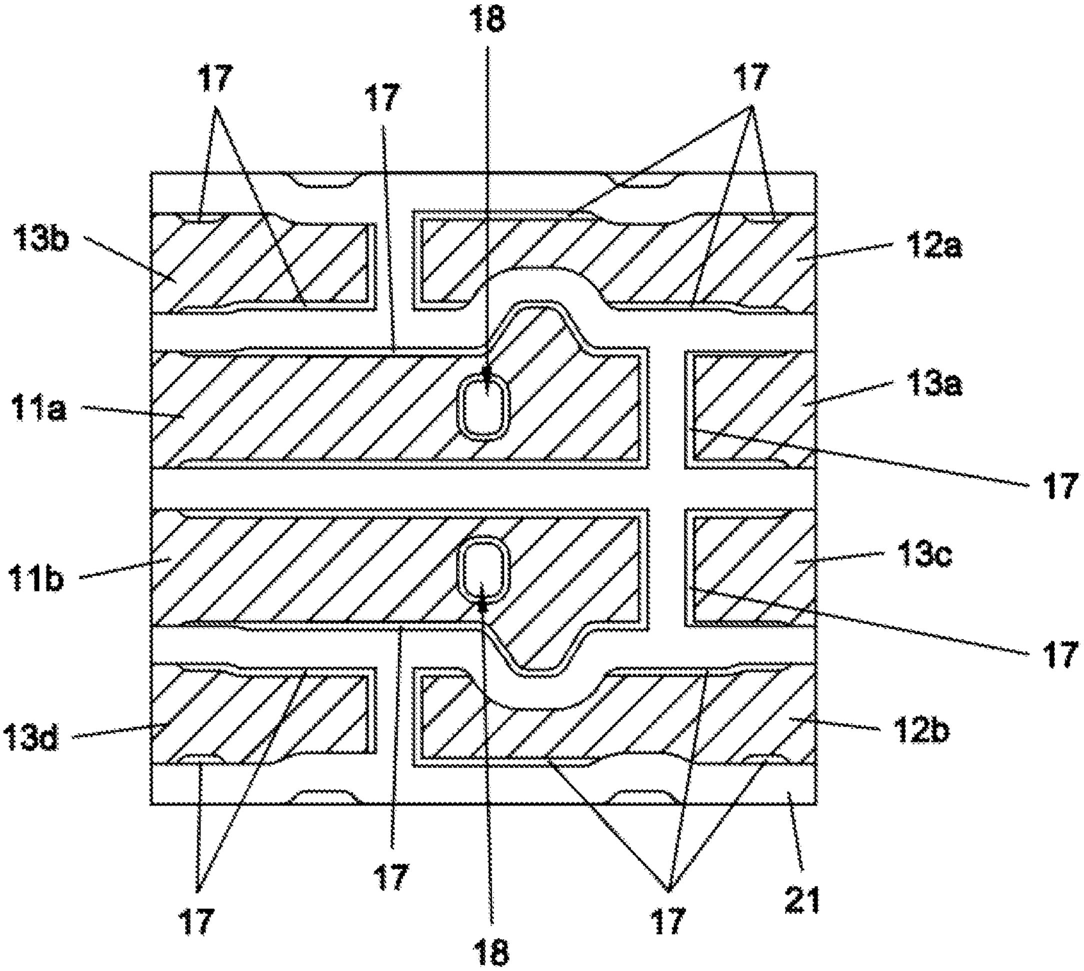
FIG. 3 is a view illustrating the structure of a back surface of a lead framework in a lamp bead holder with multiple light-emitting surfaces according to the present disclosure.
Figure 4:
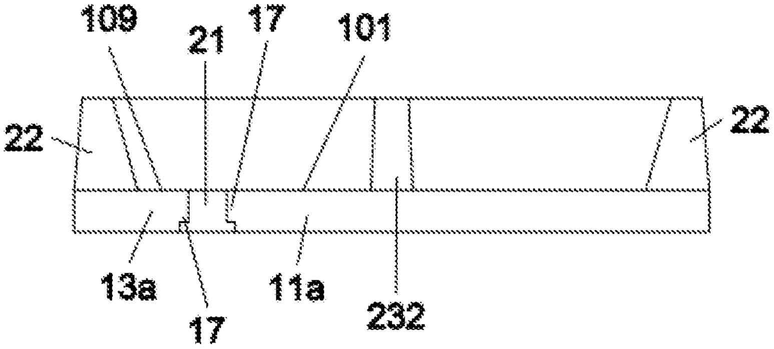
FIG. 4 is a sectional view taken along the A-A direction of FIG. 1.

As shown in FIGS. 1 to 3, to display the structure of the lead framework 1 more clearly, FIG. 2 illustrates the pad arrangement of the front surface of the lead framework 1 with the bowl-shaped cup 2 removed. The lead framework 1 specifically includes eight pads spaced apart and eight pins disposed on the exterior of the bowl-shaped cup 2. The clearances between adjacent pads are filled with cup bottom 21 of the bowl-shaped cup 2 so that the eight pads can be insulated from each other. Ends of the eight pads are connected to the eight pins respectively. Each pad is a strip-shaped metal plate whose length is substantially disposed along the direction of the first baffle 231. Front surfaces of the eight pads are exposed within the four cavities respectively to form function portions. The eight pins are divided into two groups of pins that are disposed on two opposite sides of the bowl-shaped cup 2. Each group of pins includes four pins.

More specifically, the eight pads are common die attachment pads 11*a* and 11*b*, common wire bonding pads 12*a* and 12*b* as well as non-common pads 13*a*, 13*b*, 13*c* and 13*d*, respectively. The common die attachment pad 11*a* is connected to the first cavity 41 and the second cavity 42, and function portions 101 and 102 electrically connected are formed within the first cavity 41 and the second cavity 42, respectively. The common die attachment pad 11*b* is connected to the third cavity 43 and the fourth cavity 44, and function portions 103 and 104 electrically connected are formed within the third cavity 43 and the fourth cavity 44, respectively. The common wire bonding pad 12*a* is connected to the first cavity 41 and the second cavity 42, and function portions 105 and 106 electrically connected are formed within the first cavity 41 and the second cavity 42, respectively. The common wire bonding pad 12*b* is connected to the third cavity 43 and the fourth cavity 44, and function portions 107 and 108 electrically connected are formed within the third cavity 43 and the fourth cavity 44, respectively. The non-common pads 13*a*, 13*b*, 13*c* and 13*d* are disposed within the first cavity, the second cavity, the third cavity and the fourth cavity respectively, and separate function portions 109, 110, 111 and 112 are formed within the four cavities, respectively.

The common wire bonding pad 12*a*, the non-common pad 13*a*, the non-common pad 13*c* and the common wire bonding pad 12*b* are respectively connected to pins P1, P2, P3 and P4 that are spaced apart on one side of the bowl-shaped cup 2, and the non-common pad 13*b*, the common die attachment pad 11*a*, the common die attachment pad 11*b* and the non-common pad 13*d* are respectively connected to pins P5, P6, P7 and P8 that are spaced apart on the other opposite side of the bowl-shaped cup 2.

As seen from FIG. 1, the function portions 101, 102, 103 and 104 are function portions that have the maximum areas in corresponding four cavities respectively and may be used as die attachment regions for placing the four LED chips respectively or may be simultaneously provided with die attachment regions and wire bonding regions for bonding wires. Moreover, all the function portions 106, 107, 108, 109, 110, 111 and 112 are disposed in positions close to the inner wall of the cup body 22 and may be provided with wire bonding regions, respectively. The function portions 109, 110, 111 and 112 formed by the non-common pads 13*a*, 13*b*, 13*c* and 13*d* are disposed at four corners within the corresponding four cavities, respectively.

More preferably, in an embodiment illustrated in the present disclosure, the function portions 101 and 103 are each provided with a die attachment region 14 and a wire bonding region 15. Due to the relatively small size of the cavities, the function portion 101 extends into the adjacent function portion 105 to form a protruded portion for supplying the wire bonding region 15, and the function portion 105 is provided with a recessed portion adapting to the protruded portion; and the function portion 103 extends into the adjacent function portion 107 to form a protruded portion for supplying the wire bonding portion 15, and the function portion 107 is provided with a recessed portion adapting to the protruded portion. Therefore, the function portions 101 and 103 may be each ensured to have a sufficient area while being provided with the die attachment region 14 and the wire bonding region 15, and a sufficient insulation distance between the function portion 101 and the adjacent function portion 105 and between the function portion 103 and the adjacent function portion 107 is also ensured, thereby satisfying the requirement of preventing a short circuit.

Moreover, to prevent a die attachment adhesive in the die attachment region 14 from diffusing into the wire bonding region 15, in the function portions 101 and 103, a groove 6 is also disposed between the die attachment region 14 and the wire bonding region 15 for accommodating and blocking the die attachment adhesive so that the wire bonding region 15 can be prevented from being polluted, being conducive to the reliability of the bonding wires. More preferably, the depth of the groove 16 is less than half the thickness of the lead framework 1, that is, less than half the thickness of a copper plate making the lead framework 1, the width of the groove 16 is greater than 0.05 millimeters, and the length of the groove 16 is greater than 0.2 millimeters; and the wire bonding size of a wire in the wire bonding region 15 is about 0.08 millimeters to 0.15 millimeters, so the groove 16 can protect the wire bonding region 15 within this range from being polluted by the die attachment adhesive.

Function portions within the first cavity 41 and the second cavity 42 and function portions within the third cavity 43 and the fourth cavity 44 are symmetrical along the first baffle 231. Two through holes 18 that pass through the lead framework 1 are symmetrical along the first baffle 231 and are disposed within the common die attachment pads 11*a* and 11*b* respectively. The second baffle 232 is disposed on the two through holes 18 and is reinforced and connected to the lead framework 1 and the cup bottom 2 through the two through holes 18.

As shown in FIGS. 2 and 3, to enhance the bonding force between the each pad and the cup bottom 2 by enlarging the bonding area, the edge of the each pad is provided with at least one protruded step 17. The at least one protruded step 17 is formed by protruding from a side surface of the each pad, with a protruded width less than 0.08 millimeters. The at least one protruded step 17 may be disposed at the edge of the front surface or the edge of the back surface of the each pad. Each protruded step 17 may be continuous, that is, formed by continuously protruding outward along the edge of the each pad, or may also be discontinuous protruded points.

Preferably, in an embodiment illustrated in the present disclosure, edges of front surfaces of function portions disposed within the four cavities within the eight pads are provided with protruded steps 17. FIG. 2 illustrates front surfaces of the eight pads. Dotted lines of the eight pads in FIG. 2 denote the edges of back surfaces of the eight pads. FIG. 3 illustrates the back surfaces of the eight pads, and the outermost solid lines of the eight pads in FIG. 3 denote the edges of the front surfaces of the eight pads. In conjunction with FIGS. 1 and 4, using protruded steps 17 of the common die attachment pad 11*a* and the common wire bonding pad 12*a* as an example, the common die attachment pad 11*a* is provided with a protruded step 17 at the front edge of the function portion 101, so the front width of the function portion 101 is slightly greater than the back width of the function portion 101, and the front area of the function portion 101 is greater than the back area of the function portion 101 so that a sufficient front area can be supplied for disposing the die attachment region 14 and the wire bonding region 15. Similarly, the common wire bonding pad 12*a* is provided with a protruded step 17 at the front edge of the function portion 109, so the front width of the function portion 109 is slightly greater than the back width of the function portion 109, and the front area of the function portion 109 is greater than the back area of the function portion 109 so that a sufficient front area can be supplied for bonding wires.

In addition, the back edge of a side portion (which is an end portion of a side connected to a respective pin) of the each pad buried within the cup body 22 may also be provided with a protruded step 17, so the back width of the side portion is greater than the front width of the side portion. Front edges and back edges of different portions within the each pad are each provided with a protruded step. This can not only ensure that function portions have front areas as large as possible but can also enlarge the contact area between the lead framework 1 and the bowl-shaped cup 2 so that embedding forces of different directions can be obtained, and the bonding strength of the lead framework 1 and the bowl-shaped cup 2 can be effectively enhanced, thereby enhancing the mechanical reliability of the holder.

The preceding protruded steps 17 and the groove 16 are obtained by using a stamping device to stamp a metal plate used for manufacturing the eight pads, and the groove 16 is an indentation that is recessed on the front surface of the pad 11*a* or the pad 11*b* but protrudes from the back surface of the pad 11*a* or the pad 11*b*.

Referring to FIGS. 5 to 9B, a lamp bead with multiple light-emitting surfaces in the present disclosure includes the preceding lamp bead holder and four light-emitting units. The four light-emitting units are disposed within the four cavities of the lamp bead holder, respectively. Each light-emitting unit includes an LED chip. The LED chip is securely connected to a die attachment region of the lead framework 1 through a die attachment adhesive.

If the each light-emitting unit is a white light-emitting unit, the LED chip within the each light-emitting unit is a blue chip, and a light conversion material is coated on the surface, which may be phosphor or a quantum dot material and is configured to be excited to generate white light. Using the surface of the blue chip being coated with a phosphor as an example, the phosphor is disposed within a respective cavity and is lower than the cross-shaped baffle 23. Light-emitting colors of the four light-emitting units may be combined freely. LED chips of the same light-emitting color or different light-emitting colors may be used for combination, and the same phosphor or different phosphors may also be used so that the lamp bead can enjoy multiple optional light distribution schemes.

The four light-emitting units are a first light-emitting unit L1, a second light-emitting unit L2, a third light-emitting unit L3 and a fourth light-emitting unit L4 respectively and are disposed within the first cavity 41, the second cavity 42, the third cavity 43 and the fourth cavity 44, respectively.

A first LED chip 31 within the first light-emitting unit L1 is secured to the die attachment region 14 of the function portion 101. A second LED chip 32 within the second light-emitting unit L2 is secured to a die attachment region of the function portion 102. A third LED chip 33 within the third light-emitting unit L3 is secured to the die attachment region 14 of the function portion 103. A fourth LED chip 34 within the fourth light-emitting unit L4 is secured to a die attachment region of the function portion 104.

Figure 5:
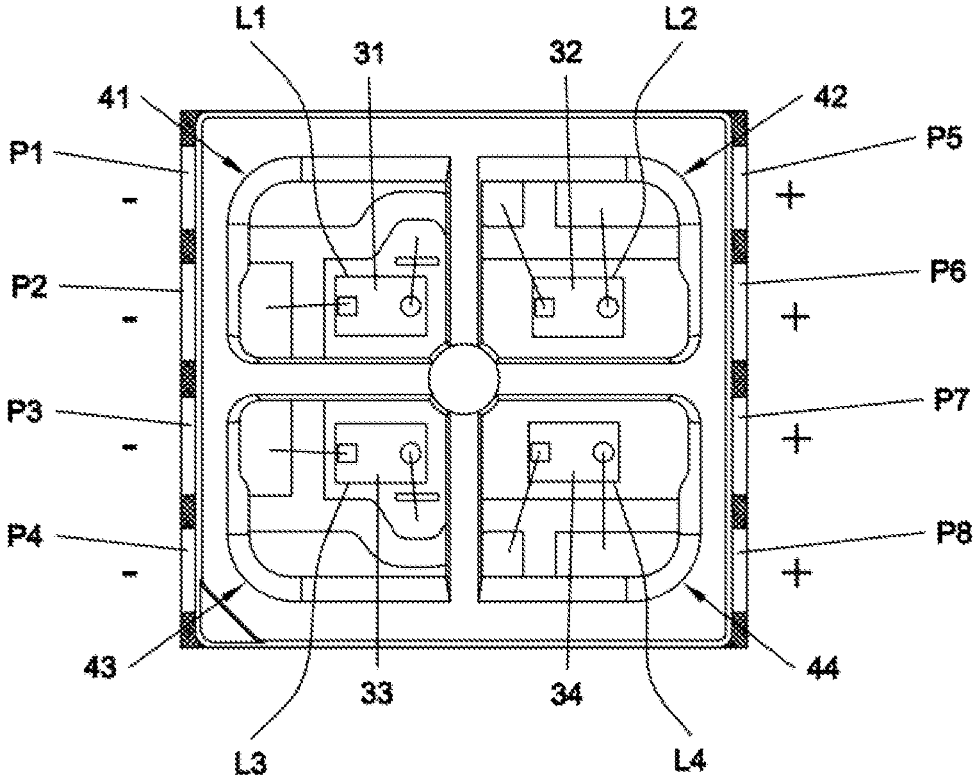
FIG. 5 is a diagram illustrating a die attachment and wire bonding manner for a lamp bead with multiple light-emitting surfaces according to the present disclosure.

As shown in FIG. 5, the lamp bead is preferably designed as four separate channels. The pins P1 to P4 serve as four negative pins, and the pins P5 to P8 serve as four positive pins. As shown in FIG. 1, the first LED chip 31 has a formal structure and is connected to the wire bonding region 15 of the function portion 101 and the function portion 109 through leads, or the first LED chip 31 has a perpendicular structure and is merely connected to the function portion 109 through a lead; the second LED chip 32 has a formal structure and is connected to the function portion 106 and the function portion 110 through leads; the third LED chip 33 has a formal structure and is connected to the wire bonding region 15 of the function portion 103 and the function portion 111 through leads, or the third LED chip 33 has a perpendicular structure and is merely connected to the function portion 111 through a lead (as shown in FIG. 7B); and the fourth LED chip 34 has a formal structure and is connected to the function portion 108 and the function portion 112 through leads.

Figure 6:
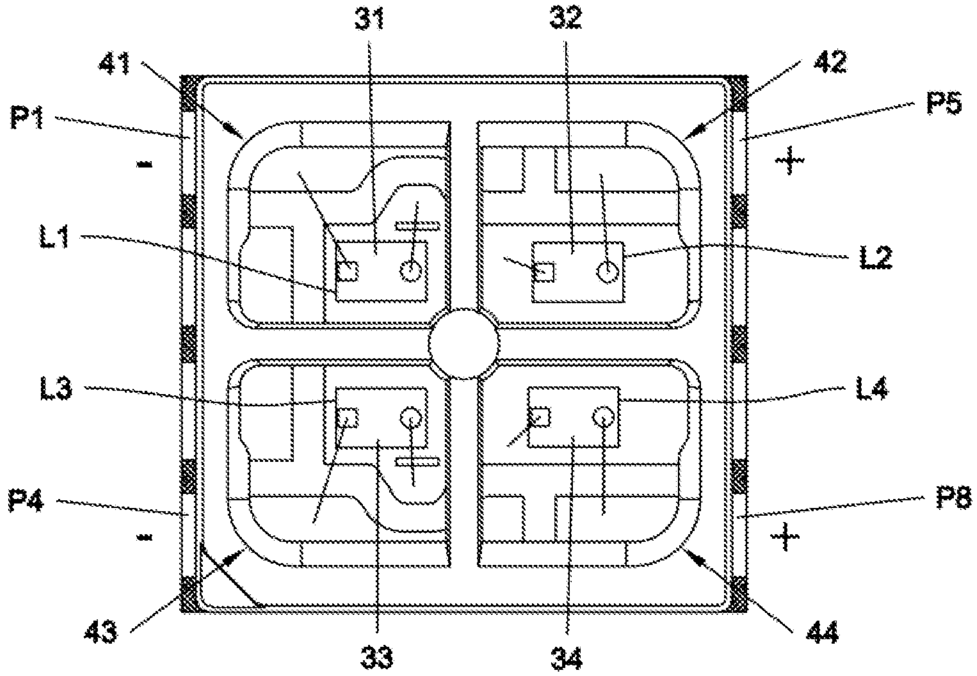
FIG. 6 is a diagram illustrating another die attachment and wire bonding manner for a lamp bead with multiple light-emitting surfaces according to the present disclosure.

As shown in FIG. 6, the lamp bead may also be designed as two channels connected in series. The pins P1 and P4 serve as two negative pins, and the pins P5 and P8 serve as two positive pins. As shown in FIG. 1, the first LED chip 31 has a formal structure and is connected to the wire bonding region 15 of the function portion 101 and the function portion 105 through leads, or the first LED chip 31 has a perpendicular structure and is merely connected to the function portion 101 through a lead; the second LED chip 32 has a formal structure and is connected to the function portion 102 and the function portion 110 through leads; the third LED chip 33 has a formal structure and is connected to the wire bonding region 15 of the function portion 103 and the function portion 107 through leads, or the third LED chip 33 has a perpendicular structure and is merely connected to the function portion 107 through a lead; and the fourth LED chip 34 has a formal structure and is connected to the function portion 104 and the function portion 112 through leads.

Figure 7A:
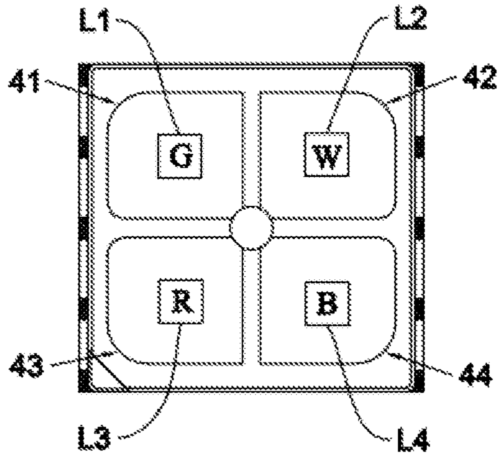
FIGS. 7A and 7B are respectively a structural diagram and a die attachment and wire bonding diagram of a lamp bead according to a preferred implementation of the present disclosure.
Figure 7B:
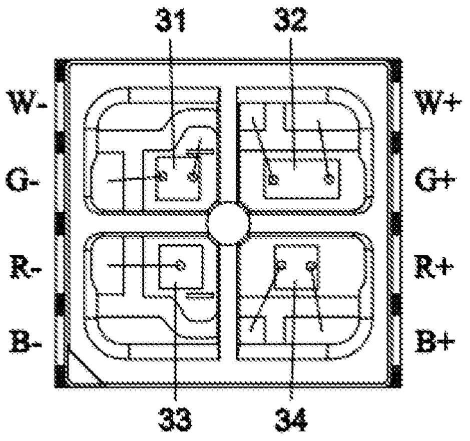

As shown in FIGS. 7A and 7B, in a preferred implementation for the lamp bead, the first light-emitting unit L1 is a green light-emitting unit (G), the first LED chip 31 is a green chip, the second light-emitting unit L2 is a white light-emitting unit (W), the second LED chip 32 is a blue chip coated with phosphor, the third light-emitting unit L3 is a red light-emitting unit (R), the third LED chip 33 is a red chip, the fourth light-emitting unit L4 is a blue light-emitting unit (B), and the fourth LED chip 34 is a blue chip, so the lamp bead emits four RGBW colors and is designed as four separate channels. The pin P1 serves as a negative pin W− of the blue chip coated with phosphor within the white light-emitting unit (W), the pin P2 serves as a negative pin G− of the green chip within the green light-emitting unit (G), the pin P3 serves as a negative pin R− of the red chip within the red light-emitting unit (R), the pin P4 serves as a negative pin B− of the blue chip within the blue light-emitting unit (B), the pin P5 serves as a positive pin W+ of the blue chip coated with phosphor within the white light-emitting unit (W), the pin P6 serves as a positive pin G+ of the green chip within the green light-emitting unit (G), the pin P7 serves as a positive pin R+ of the red chip within the red light-emitting unit (R), and the pin P8 serves as a positive pin B+ of the blue chip within the blue light-emitting unit (B).

Figure 8A:
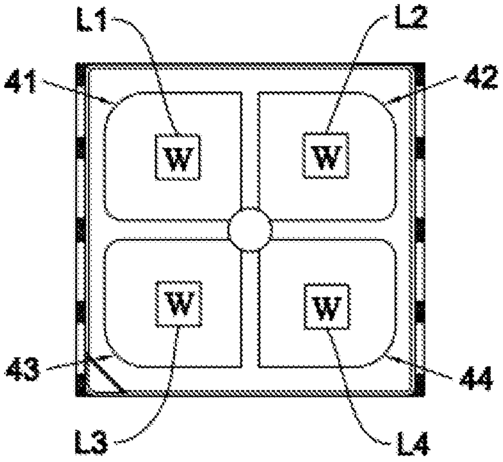
FIGS. 8A and 8B are respectively a structural diagram and a die attachment and wire bonding diagram of a lamp bead according to another preferred implementation of the present disclosure.
Figure 8B:
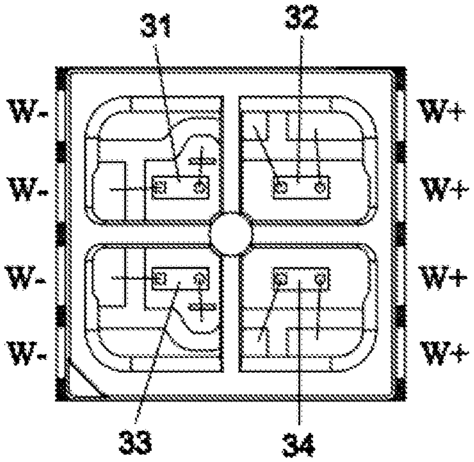

As shown in FIGS. 8A and 8B, in another preferred implementation for the lamp bead, all the four light-emitting units are white light-emitting units (W), the first LED chip 31, the second LED chip 32, the third LED chip 33 and the fourth LED chip 34 are blue chips coated with the same phosphor or different phosphors on their surfaces, so a white-light spectrum emitted by the lamp bead is adjustable, and the lamp bead is designed as four separate channels. The pins P1 to P4 serve as negative pins W− of the blue chips within the four white light-emitting units (W) respectively, and the pins P5 to P8 serve as positive pins W+ of the blue chips within the four light-emitting units (W) respectively.

Figure 9A:
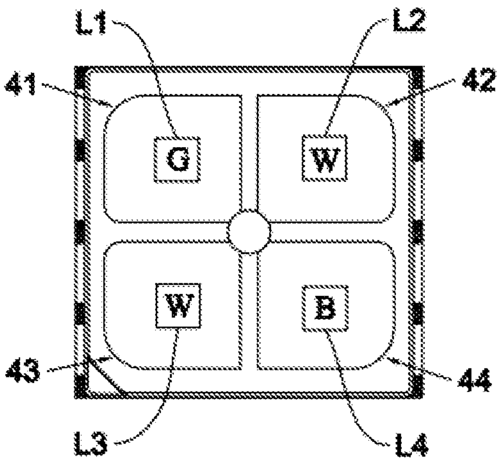
FIGS. 9A and 9B are respectively a structural diagram and a die attachment and wire bonding diagram of a lamp bead according to yet another preferred implementation of the present disclosure.
Figure 9B:
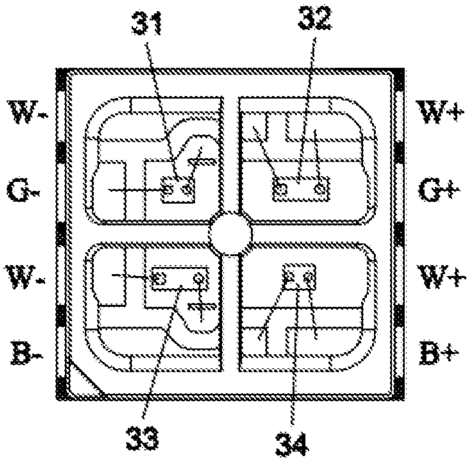

As shown in FIGS. 9A and 9B, in yet another preferred implementation for the lamp bead, the first light-emitting unit L1 is a green light-emitting unit (G), the first LED chip 31 is a green chip, the second light-emitting unit L2 is a white light-emitting unit (W), the second LED chip 32 is a blue chip coated with phosphor, the third light-emitting unit L3 is a white light-emitting unit (W), the third LED chip 33 is a blue chip coated with phosphor, the fourth light-emitting unit L4 is a blue light-emitting unit (B), and the fourth LED chip 34 is a blue chip, so when the lamp bead is designed as four separate channels, the pin P1 serves as a negative pin W− of the blue chip coated with phosphor within the white light-emitting unit (W) within the second cavity 42, the pin P2 serves as a negative pin G− of the green chip within the green light-emitting unit (G), the pin P3 serves as a negative pin W− of the blue chip coated with phosphor within the white light-emitting unit (W) within the third cavity 43, the pin P4 serves as a negative pin B− of the blue chip within the blue light-emitting unit (B), the pin P5 serves as a positive pin W+ of the blue chip coated with phosphor within the white light-emitting unit (W) within the second cavity 42, the pin P6 serves as a positive pin G+ of the green chip within the green light-emitting unit (G), the pin P7 serves as a positive pin W+ of the blue chip coated with phosphor within the white light-emitting unit (W) within the third cavity 43, and the pin P8 serves as a positive pin B+ of the blue chip within the blue light-emitting unit (B).

The lamp bead described in the present disclosure is applicable to various light-emitting devices, and the light-emitting devices including the lamp bead may be applied to products in aspects of brightening, smart lighting, plant lighting and healthy lighting.

Since the lamp bead holder used in the present disclosure has a unique design of the four cavities arranged in the 2×2 array and corresponding pads, the four LED chips may be placed within the lamp bead. Although the overall size of the lamp bead is limited, the each cavity may be filled with LED chips with various normal usage specifications, including a 1130 chip (whose size is 11 mil*30 mil), a 1114 chip (whose size is 11 mil*14 mil), a 1025 chip (whose size is 10 mil*25 mil), a 1726 chip (whose size is 17 mil*26 mil) and others. The each cavity and the function portion disposed within the each cavity may satisfy the process requirements of die attachment and wire bonding of various chips.

Meanwhile, the four separate cavities within the lamp bead holder enable the light-emitting units within the four cavities to separately emit light without interference from each other, being conducive to the separate light adjustment and color adjustment of the four light-emitting units by altering the types of the LED chips or altering the coated phosphor. Light distribution schemes of the described lamp bead may include the preceding implementations.

Specifically, in the case where the four light-emitting units of the lamp bead are white light-emitting units, light emitted by a respective blue chip within each white light-emitting unit is only excited by phosphor within a cavity in which the each white light-emitting unit is located to generate corresponding white light and is not affected by phosphors in other cavities. Therefore, the types of phosphors disposed within the four cavities may be adjusted flexibly. Multiple optional combinations of the four blue chips and the phosphors coated on the four chips can achieve spectrum adjustment and multi-color temperature intelligent adjustment and control to obtain various lamp beads satisfying the application requirements of smart lighting, plant lighting and healthy lighting. Similarly, when the four light-emitting units of the lamp bead have an RGBW design, the light and color of the each light-emitting unit may also be adjusted separately to satisfy the requirement effect of application scenarios such as brightening and smart lighting.

In addition, with the arrangement of the eight pads of the lead framework and the eight pins in the lamp bead holder, through different wire bonding manners, the four LED chips within the four cavities of the lamp bead may be designed as the four separate channels (as shown in FIG. 5), so one positive pin and one negative pin are separately used for the four LED chips respectively or may also be designed as the two channels connected in series (as shown in FIG. 6), so two of the four LED chips are connected in series and share one positive pin and one negative pin, and the other two of the four LED chips are connected in series and share one positive pin and one negative pin.

In the description of the present disclosure, it is to be understood that orientations or position relations indicated by terms such as "center", "row", "column", "length", "width", "thickness", "upper", "lower", "front", "back", "left", "right", "vertical", "horizontal", "top", "bottom", "in", "out", "clockwise" and "counterclockwise" are based on the drawings. These orientations or position relations are intended only to facilitate and simplify the description of the present disclosure and not to indicate or imply that a device or element referred to must have such particular orientations or must be configured or operated in such particular orientations.

Moreover, terms such as "first", "second" and "third" are merely for description and are not to be construed as indicating or implying relative importance or implicitly indicating the number of technical features as indicated. Therefore, a feature defined as "first", "second", and "third" may explicitly or implicitly include one or more features. In the description of the present disclosure, "multiple" means two or more, unless otherwise specifically limited.

In the present disclosure, terms "mounted", "joined" and "connected" are to be understood in a broad sense unless otherwise expressly specified and limited. For example, the term "connected" may refer to "securely connected", "detachably connected" or "integrally connected", may refer to "mechanically connected", or may refer to "connected directly", "connected indirectly through an intermediary", or "connected inside two components". For those of ordinary skill in the art, specific meanings of the preceding terms in the present disclosure may be understood based on specific situations.

What is claimed is:

1. A lamp bead holder with a plurality of light-emitting surfaces, comprising a lead framework and a bowl-shaped cup, wherein the bowl-shaped cup comprises a cup bottom and a cup body, the lead framework is embedded within the cup bottom, the cup body is disposed on the lead framework; and the bowl-shaped cup further comprises a cross-shaped baffle, the cross-shaped baffle is disposed within the bowl-shaped cup to divide an inner cavity of the bowl-shaped cup into four cavities arranged in a 2×2 array:

wherein the lead framework comprises eight pads spaced apart, clearances between adjacent pads are filled with the cup bottom of the bowl-shaped cup to enable the eight pads to be insulated from each other, and the eight pads are connected to pins disposed on an exterior of the bowl-shaped cup respectively.

2. The lamp bead holder according to claim 1, wherein the lead framework exposes three adjacent function portions in each of the four cavities, wherein the three adjacent function portions are spaced apart and insulated from each other.

3. The lamp bead holder according to claim 2, wherein in two cavities of the four cavities in a same row, two of three function portions in one cavity are electrically connected to two of three function portions in another cavity respectively, and a remaining one of the three function portions in the one cavity is insulated from a remaining one of the three function portions in the another cavity.

4. The lamp bead holder according to claim 3, wherein in each of the four cavities, one of the three function portions that is nearest to a center of the cross-shaped baffle has a maximum area; and in two cavities in a same row, one of the three function portions that has a maximum area in one cavity is electrically connected to one of the three function portions that has a maximum area in another cavity.

5. The lamp bead holder according to claim 4, wherein one of three function portions that has a maximum area in each of at least one of the four cavities is provided with a die attachment region and a wire bonding region.

6. The lamp bead holder according to claim 5, wherein a groove is disposed between the die attachment region and the wire bonding region.

7. The lamp bead holder according to claim 6, wherein a depth of the groove is less than half a thickness of the lead framework, a width of the groove is greater than 0.05 millimeters, and a length of the groove is greater than 0.2 millimeters.

8. The lamp bead holder according to claim 1, wherein an edge of each of the eight pads is provided with a protruded step.

9. The lamp bead holder according to claim 1, wherein the eight pads are two common die attachment pads, two common wire bonding pads and four non-common pads respectively;

the two common die attachment pads are disposed within two rows of the four cavities respectively, and each of the two common die attachment pads is connected to two cavities in a row in which the each of the two common die attachment pads is located, and two function portions electrically connected are formed within the two cavities in a same row;

the two common wire bonding pads are disposed within the two rows of the four cavities respectively, and each of the two common wire bonding pads is connected to two cavities in a row in which the each of the two common wire bonding pads is located, and two function portions electrically connected are formed within the two cavities in the row respectively; and the four non-common pads are disposed within a same row, and four function portions are formed within the four cavities respectively.

10. The lamp bead holder according to claim 1, wherein the cross-shaped baffle is disposed on the lead framework and the cup bottom of the bowl-shaped cup, and is connected to the lead framework through a through hole that passes through the lead framework.

11. A lamp bead with a plurality of light-emitting surfaces, comprising the lamp bead holder according to claim 1 and four light-emitting units, wherein the four light-emitting units are disposed within the four cavities of the lamp bead holder respectively, and each of the four light-emitting units comprises a light-emitting diode (LED) chip connected to the lead framework.

12. The lamp bead according to claim 11, wherein ends of the eight pads are connected to four positive pins disposed on one side of the bowl-shaped cup and four negative pins disposed on another side of the bowl-shaped cup respectively, wherein the one side of the bowl-shaped cup and the another side of the bowl-shaped cup are opposite sides of the bowl-shaped cup.

13. The lamp bead according to claim 11, wherein the lead framework exposes three adjacent function portions in each of the four cavities, wherein the three adjacent function portions are spaced apart and insulated from each other.

14. The lamp bead according to claim 13, wherein in two cavities of the four cavities in a same row, two of three function portions in one cavity are electrically connected to two of three function portions in another cavity respectively, and a remaining one of the three function portions in the one cavity is insulated from a remaining one of the three function portions in the another cavity.

15. The lamp bead according to claim 14, wherein in each of the four cavities, one of the three function portions that is nearest to a center of the cross-shaped baffle has a maximum area; and in two cavities in a same row, one of the three function portions that has a maximum area in one cavity is electrically connected to one of the three function portions that has a maximum area in another cavity.

16. The lamp bead according to claim 15, wherein one of three function portions that has a maximum area in each of at least one of the four cavities is provided with a die attachment region and a wire bonding region.

17. The lamp bead according to claim 16, wherein a groove is disposed between the die attachment region and the wire bonding region.

18. The lamp bead according to claim 17, wherein a depth of the groove is less than half a thickness of the lead framework, a width of the groove is greater than 0.05 millimeters, and a length of the groove is greater than 0.2 millimeters.

* * * * *